United States Patent [19]

Priniski

[11] 4,285,065
[45] Aug. 18, 1981

[54] RADIO WITH AUDIO GRAPHIC EQUALIZER

[75] Inventor: David J. Priniski, Lake-in-the-Hills, Ill.

[73] Assignee: Motorola, Inc., Schaumburg, Ill.

[21] Appl. No.: 114,018

[22] Filed: Jan. 21, 1980

[51] Int. Cl.³ .......................... H04B 1/16; H03G 3/02
[52] U.S. Cl. .................................. 455/158; 333/28 T; 455/159; 455/177; 455/200; 455/233
[58] Field of Search ............................... 455/154–159, 455/177, 200, 232–234; 333/28 R, 28 T; 179/1 D; 358/192.1

[56] References Cited

U.S. PATENT DOCUMENTS

| | | | |
|---|---|---|---|
| 2,907,838 | 10/1959 | Ross | 330/172 |
| 3,651,469 | 3/1972 | Keese | 340/168 R |
| 3,673,499 | 6/1972 | Avins et al. | 334/30 |
| 3,746,788 | 7/1973 | Fenne | 179/1 GQ |
| 3,750,044 | 7/1973 | Stanley | 333/28 R |
| 3,755,763 | 8/1973 | Hoshi | 334/15 |
| 3,803,494 | 4/1974 | Howell et al. | 455/165 |
| 3,914,716 | 10/1975 | Kurata | 333/28 T |
| 3,921,104 | 11/1975 | Gundry | 333/28 R |
| 3,968,440 | 7/1976 | Ehni | 180/ |
| 4,081,752 | 3/1978 | Sumi | 455/165 |
| 4,087,793 | 5/1978 | Lucas | 455/232 |
| 4,135,158 | 1/1979 | Parmet | 455/159 |

FOREIGN PATENT DOCUMENTS 1912159 9/1970 Fed. Rep. of Germany .
2540235 4/1977 Fed. Rep. of Germany .

OTHER PUBLICATIONS

Motorola Sales Brochure for Graphic Equalizers–Jul. 1978.
Automotive News–Jul. 2, 1976–Advertisement for Delco Graphic Equalizer.

Primary Examiner—Marc E. Bookbinder
Attorney, Agent, or Firm—Phillip H. Melamed; James W. Gillman

[57] ABSTRACT

A pushbutton tunable radio having an integral audio graphic equalizer is disclosed. During a tuning mode of operation for the radio actuation of any of five presettable pushbuttons results in the selection of a predetermined radio channel frequency within the AM or FM band, and a five digit display is provided indicating the selected channel frequency. During an equalizer mode of operation caused by actuation an equalizer mode selecting pushbutton, the radio remains tuned to the previously selected radio channel, but the frequency indicating display is now replaced by an electronic display indicating the relative emphasis of a plurality of subbands for the corresponding audio signals produced in response to the received radio channel. In the equalizer mode, actuation of any of the presettable radio pushbuttons results in selecting a corresponding one of the audio subbands for adjustment of its relative emphasis. The radio includes up and down manual pushbutton switches which provide for tuning the radio in discrete tuning increments in either upward or downward directions during the tuning mode of the radio. During the equalizer mode, after one of the subbands has been selected by actuation of one of the presettable pushbuttons, actuation of the up or down tuning pushbuttons will cause a corresponding upward or downward discrete increment adjustment of the relative emphasis of the selected one of the audio subbands.

17 Claims, 7 Drawing Figures

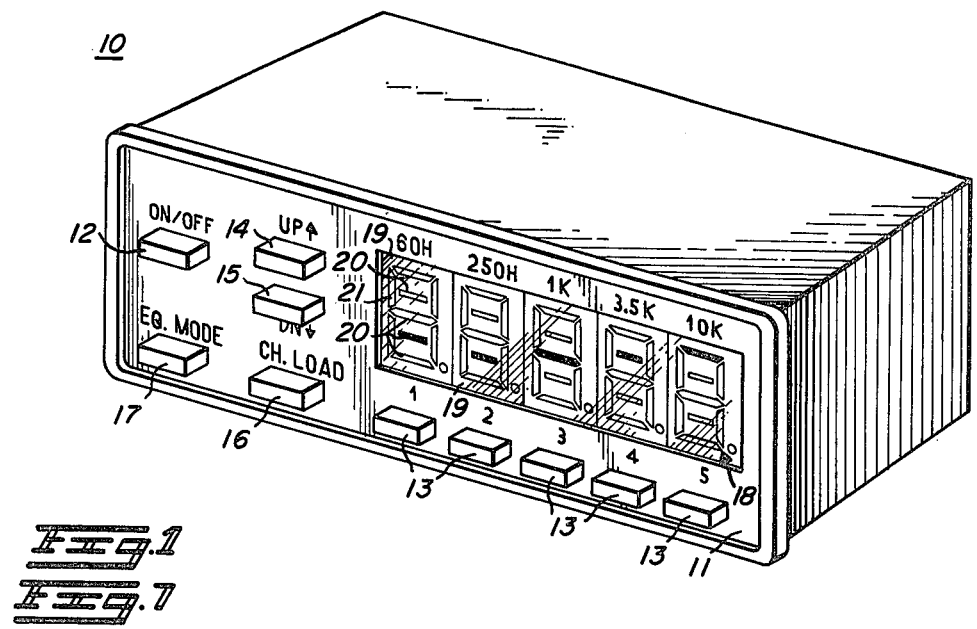
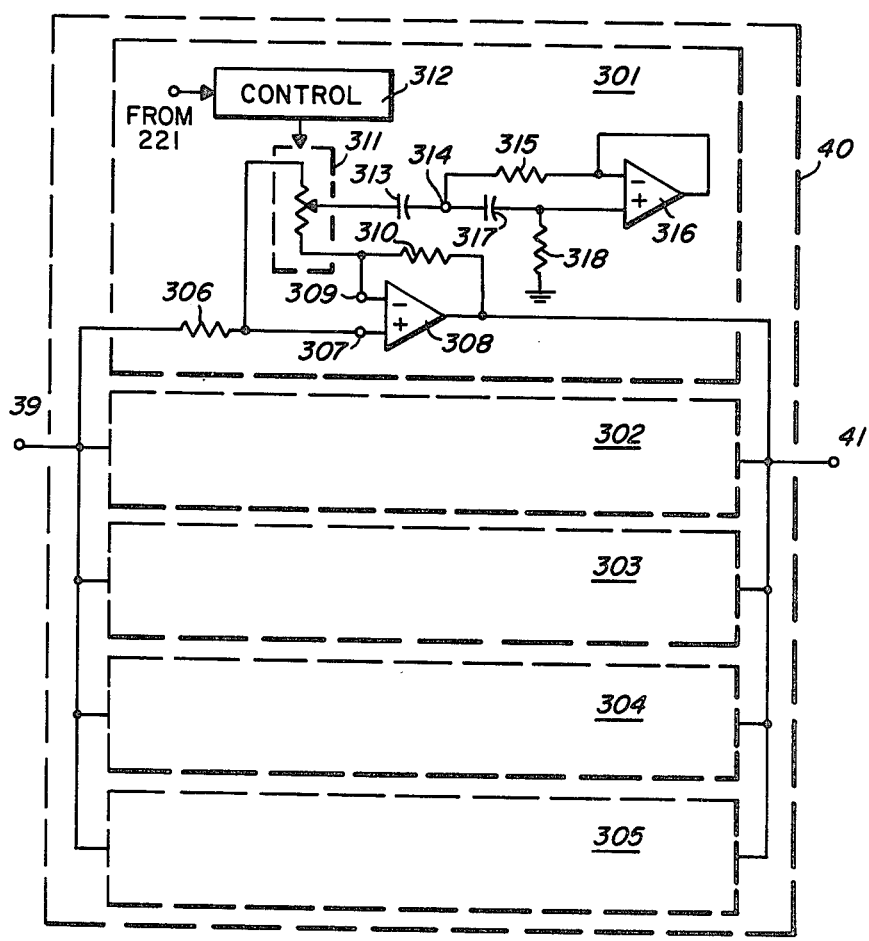
Fig. 1
Fig. 7

Fig. 5

RADIO WITH AUDIO GRAPHIC EQUALIZER

BACKGROUND OF THE INVENTION

The invention generally relates to the field of entertainment devices which have their audio frequency response determined by graphic equalizers which provide for the separate adjustment of the relative emphasis of a plurality of audio subbands within the audio band while providing a visual graphic indication of the relative emphasis. More specifically, the present invention relates to a pushbutton tunable radio with an integral audio graphic equalizer.

In general, graphic equalizers which allow for the separate adjustment of a plurality of audio subbands so that the audio frequency response of an entertainment device can be operator adjusted so as to suit the operator's personal preference have been available only as discrete add-on units to existing entertainment devices. In these discrete add-on units, the amount of emphasis for each of the audio subbands is controlled by the position of a manual control and the amount of relative emphasis for each subband is displayed by the visual position of the manual control. These discrete add-on units have been combined with the pushbutton tunable radios that are in common use in automobiles. The resultant combination, while allowing the radio operator to customize the audio response of the radio to his own desires, takes up appreciable dashboard space in the automobile and provides the radio operator with a total entertainment system which is complex to adjust and has an aesthetically displeasing appearance due to the space requirements of the controls and displays of both the radio and graphic equalizer.

SUMMARY OF THE INVENTION

An object of the present invention is to provide an improved entertainment device with an audio graphic equalizer wherein the space and complexity deficiencies of the prior art entertainment systems noted above are overcome while providing an aesthetically pleasing appearance.

A more particular object of the present invention is to provide an improved pushbutton radio having an integral audio graphic equalizer.

According to one feature of the present invention an improved multichannel entertainment device with an audio graphic equalizer is disclosed. The entertainment device comprises: entertainment means which are tunable to select any of a plurality of entertainment channels for providing corresponding audio signals in an audio band related to the tuned entertainment channel; equalizer means coupled to said entertainment means for independently adjusting the relative emphasis of said audio signals in each of a plurality of subbands within said audio band; visual display means for selectively providing, in a tuning mode, an electronic display indicating the entertainment channel to which the entertainment means is tuned, and for providing, in an equalizer mode, an electronic display indicating the relative emphasis provided by said equalizer means to the audio signals in said plurality of subbands; and control means coupled to said entertainment means, said equalizer means and said display means for selectively implementing said equalizer mode wherein said display means displays the relative audio emphasis of said subbands rather than said tuned entertainment channel indication, and for selectively implementing said tuning mode for said entertainment means wherein said display means displays the tuned entertainment channel indication rather than the relative emphasis for said audio subbands.

According to another feature of the present invention an improved entertainment device is provided with an audio graphic equalizer wherein manual tubing controls are utilized in a tuning mode to select channels for the entertainment device and these same manual controls are utilized in the equalizer mode to select predetermined audio subbands of audio signals produced by the entertainment device for adjustment of relative emphasis.

The preferred embodiment of the present invention combines both of the above features to obtain a compact entertainment device having a fewer number of controls and displays which thereby simplifies the mode of operation of the entertainment device while providing an entertainment device readily adaptable for dashboard insertion in an automobile and which has an aesthetically pleasing control panel and display appearance.

Preferably, the entertainment device comprises a pushbutton tunable radio which is tunable in the tuning mode to any one radio channel in a radio band by actuation of a corresponding pushbutton presettable to directly recall any frequency in the radio band. In addition, the radio includes manual tuning means, preferably comprising up and down scan switches, for stepping the radio tuning in the tuning mode upward or downward in discrete tuning increments over the radio band. The equalizer means is preferably electronically controlled. During the implementation of the equalizer mode by the control means, the control means utilizes the actuation of the presettable pushbuttons to produce control signals which select a predetermined one of said audio subbands for emphasis adjustment while the control means utilizes electronic control signals produced by actuation of the up or down scan switches to adjust the relative emphasis of the selected audio subband. During the tuning mode, the control means causes the display means to provide an Arabic numeral indication of the radio frequency of the selected radio channel to which the radio is tuned. In the equalizer mode, the control means controls the display means to provide the simultaneous electronic display of the relative emphasis provided in all of the plurality of audio subbands.

The present invention contemplates the use of a common display providing an indication of the selected radio channel frequency in a tuning mode and providing an indication of the relative emphasis of audio signals in all of a plurality of audio subbands in an equalizer mode. The present invention also contemplates the use of radio tuning controls, including presettable pushbuttons for recalling predetermined radio stations and UP/DOWN tuning scan means, for tuning the radio to predetermined radio channels in a radio band, while also providing for the use of these same tuning controls, in an equalizer mode, to select and adjust the relative emphasis of different subbands within the audio band. Through the combination of these novel features, the present invention provides a simplified and compact radio having an integral graphic equalizer which can be readily installed in the dashboard of an automobile.

BRIEF DESCRIPTION OF THE DRAWINGS

For a more complete understanding of the present invention reference should be made to the drawings, in which:

FIG. 1 is a perspective view of a radio receiver having an integral graphic equalizer;

FIG. 5 is a detailed schematic diagram of a possible embodiment for the components illustrated in FIG. 3;

FIG. 7 is a schematic diagram illustrating a typical structure for the equalizer circuit shown in FIG. 2.

DESCRIPTION OF THE PREFERRED EMBODIMENT

Figure 2:
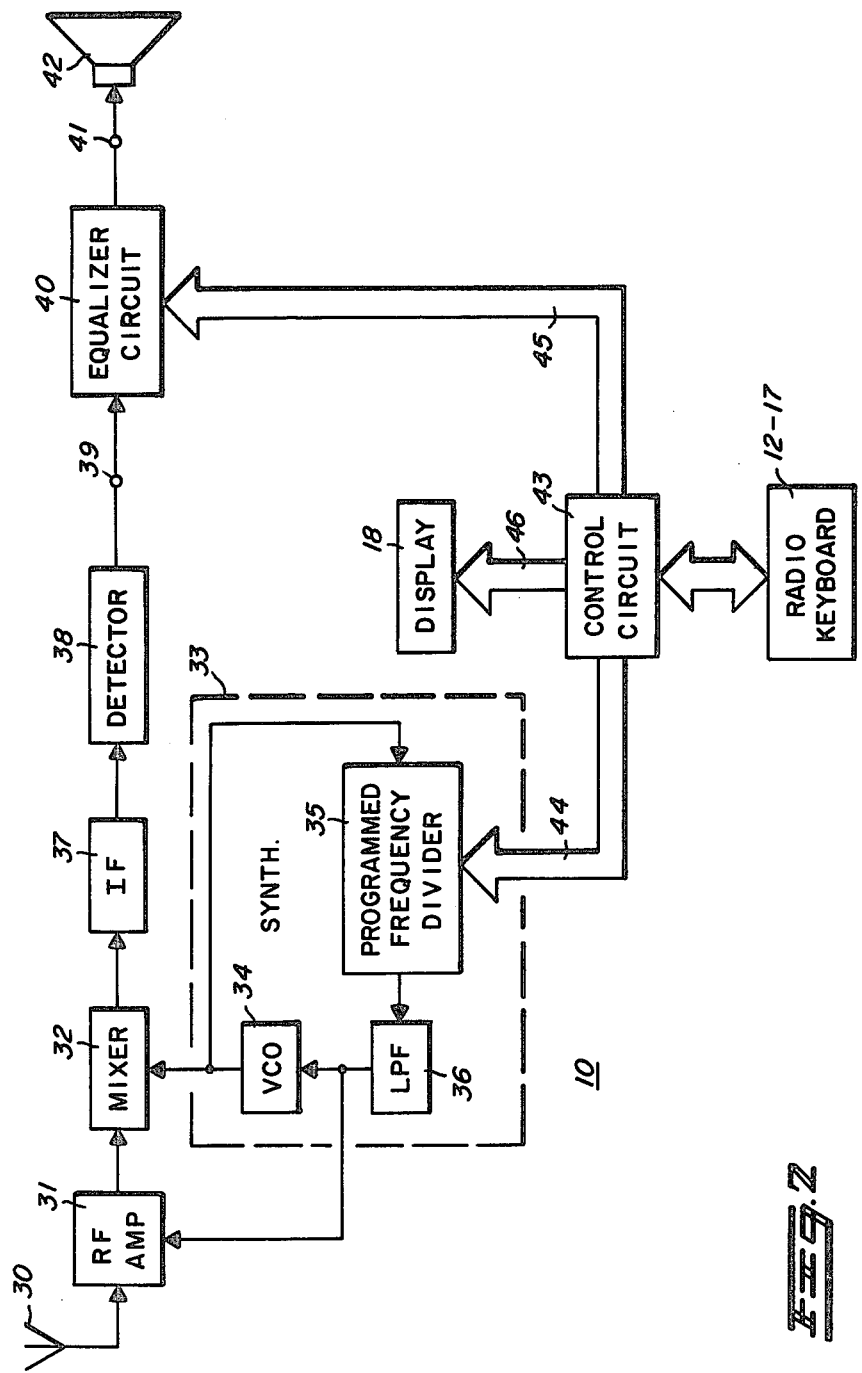
FIG. 2 is a schematic diagram illustrating in block form the electrical components, including a control circuit display, and equalizer circuit, of the radio receiver shown in FIG. 1.

FIG. 1 illustrates an electronic pushbutton tunable radio receiver 10 having an integral graphic equalizer. The receiver 10 is intended for installation in the dashboard of an automobile such that a front control panel 11 of the receiver carrying manual pushbutton controls 12–17 and a display 18 will be visible.

A receiver ON/OFF pushbutton 12 is mounted on the control panel 11 and controls the ON/OFF operation of the receiver 10. A plurality of five pushbuttons 13, each designated by an integer legend 1 through 5, are present on the front panel 11 and actuation of any one of these pushbuttons, in a tuning mode of the radio receiver 10, will result in electronically tuning the radio receiver directly to a preselected, predetermined channel frequency in either the AM or FM band. The manner in which this is accomplished will be discussed subsequently. UP and DOWN tuning scan pushbuttons 14 and 15 are also mounted on the front panel 11 and actuation of these pushbuttons, in the tuning mode of the receiver 10, result in step-tuning the radio receiver, in discrete tuning increments, through each channel frequency in either the AM or FM band. A CHANNEL LOAD pushbutton 16 is also present on the front panel 11 and causes the presetting of any one of the pushbuttons 13 to a desired radio channel frequency such that the subsequent actuation of the pushbutton 13 will directly recall the preset frequency. This occurs in a manner to be discussed subsequently. The front panel 11 also carries an EQUALIZER MODE pushbutton 17 which alternately selects, upon actuation, either an equalizer mode for the radio receiver 10 or the tuning mode for the radio receiver 10.

In addition to the manual pushbutton controls 12–17 on the front panel 11, the front panel also carries a display 18 comprising five individual nine-segment character display units 19 disposed in a linear horizontal array with each character display unit 19 disposed in a direct vertical relationship with each of the pushbuttons 13 which are also arranged in a linear horizontal array. Associated with each of the display units 19 are the frequency indicating legends 60H, 250H, 1K, 3.5K and 10K, disposed on the panel 11 from left to right in the recited order and representing five contiguous audio frequency subbands represented by the frequencies 60 Hz, 250 Hz, 1 KHz, 3.5 KHz and 10 KHz.

In FIG. 1, the display 18 is illustrated as displaying the relative emphasis for the five audio subbands for audio signals produced by the radio receiver 10 in correspondence to received radio frequency signals. This is accomplished by the selective electronic illumination of any one of five vertically stacked horizontal bars 20 which comprise each of the individual nine-segment display units 19. Thus the radio receiver 10, when in the equalizer mode selected by actuation of the pushbutton 17, utilizes the display 18 to graphically illustrate, simultaneously, the amount of relative emphasis provided for the five audio subbands within the audio band extending through 60 Hz to 10 KHz. In the tuning mode for the radio receiver 10, it is contemplated that the display 18 will indicate, in Arabic numeral form, the channel frequency to which the radio receiver 10 is tuned. This is accomplished by the selective illumination of four vertical bars 21 of each of the nine-segment display units 19 along with the selective illumination of the upper, middle and lower bars of the five horizontal bars 20. Thus the nine-segment display units 19 merely represent a minor modification of the standard seven-segment display units having four vertical bars and three horizontal bars which are commonly used in providing electronic numerical displays. It is understood that each of the display units 19 may also have an associated decimal point which may be selectively illuminated.

FIG. 2 illustrates an overall schematic block diagram for the radio receiver 10. In all figures, identical reference numbers are utilized to illustrated corresponding structures.

The receiver 10 is a superheterodyne receiver and is shown in FIG. 2 as comprising an antenna 30 which is directly coupled as an input to a turnable RF amplifier 31 that supplies an amplified input signal to a frequency mixer stage 32. The receiver includes a frequency synthesizer, generally designated by the numeral 33 and shown dashed in FIG. 2, which comprises a voltage controlled oscillator (VCO) 34 which supplies a mixing input signal to the mixer 32. This signal from the VCO also serves as an input to a programmable frequency divider 35 which, in accordance with received control signals, supplies a frequency divided signal as an input to a LOW PASS FILTER (LPF) 36 that in turn supplies a control signal to the VCO 34 as well as a tuning signal to the RF amplifier 31. Essentially the synthesizer 33 comprises a known phase locked loop digitally controlled frequency synthesizer whose operation is well known to those skilled in the art and will therefore not be further discussed.

The mixer 32 receives the amplified RF signals from the RF amplifier 3 and mixing frequency input signal from the synthesizer 33 and supplies an IF signal to an IF amplifier stage 37 which in turn supplies an input signal to a signal detector 38 which provides a corresponding audio frequency signal at an audio input terminal 39.

The audio input terminal 39 is connected as an input to an audio equalizer circuit 40 which provides an output at an audio signal terminal 41 that serves as the input terminal to a speaker stage 42. It is contemplated that the equalizer circuit 40 comprises an electronically controlled equalizer circuit which essentially takes the audio signals at the terminal 39, divides them into five contiguous subbands each including the reference frequencies 60 Hz, 250 KHz, 1 KHz, 3.5 KHz and 10 KHz, respectively, provides predetermined relative emphasis to each of these subbands in accordance with received control signals, and recombines all of these selectively emphasized subbands at the audio terminal 41.

A control circuit 43 is coupled to and essentially monitors and radio receiver keyboard, which comprises the manual pushbutton controls 12–17, and provides electronic control signals to the programmable frequency divider 35, the equalizer circuit 40, and the display 18 along signal connection paths 44–46, respectively, shown in FIG. 2. Thus the control circuit 43 controls the tuning operation of the radio receiver by controlling the programmable frequency divide-by relationship of the divider 35, while controlling the operation of the electronically controlled equalizer circuit 40 and controlling the visual display produced by the display 18. Essentially the control circuit 43 implements all of the desired modes of operation of the radio receiver 10 previously discussed in conjunction with the manual controls and display shown in FIG. 1. This is accomplished through the utilization of a microprocessor in the control circuit 43 causing the implementation of these features. This will now be discussed in more detail with respect to FIGS. 3–6 which illustrate in block diagram and flow chart form the operation of a typical control circuit 43 which can be readily implemented through microprocessor programming. Subsequently, FIG. 7 will be discussed with respect to its disclosure of electronically controllable circuitry for implementing the equalizer circuit 40 shown in FIG. 2.

Figure 3:
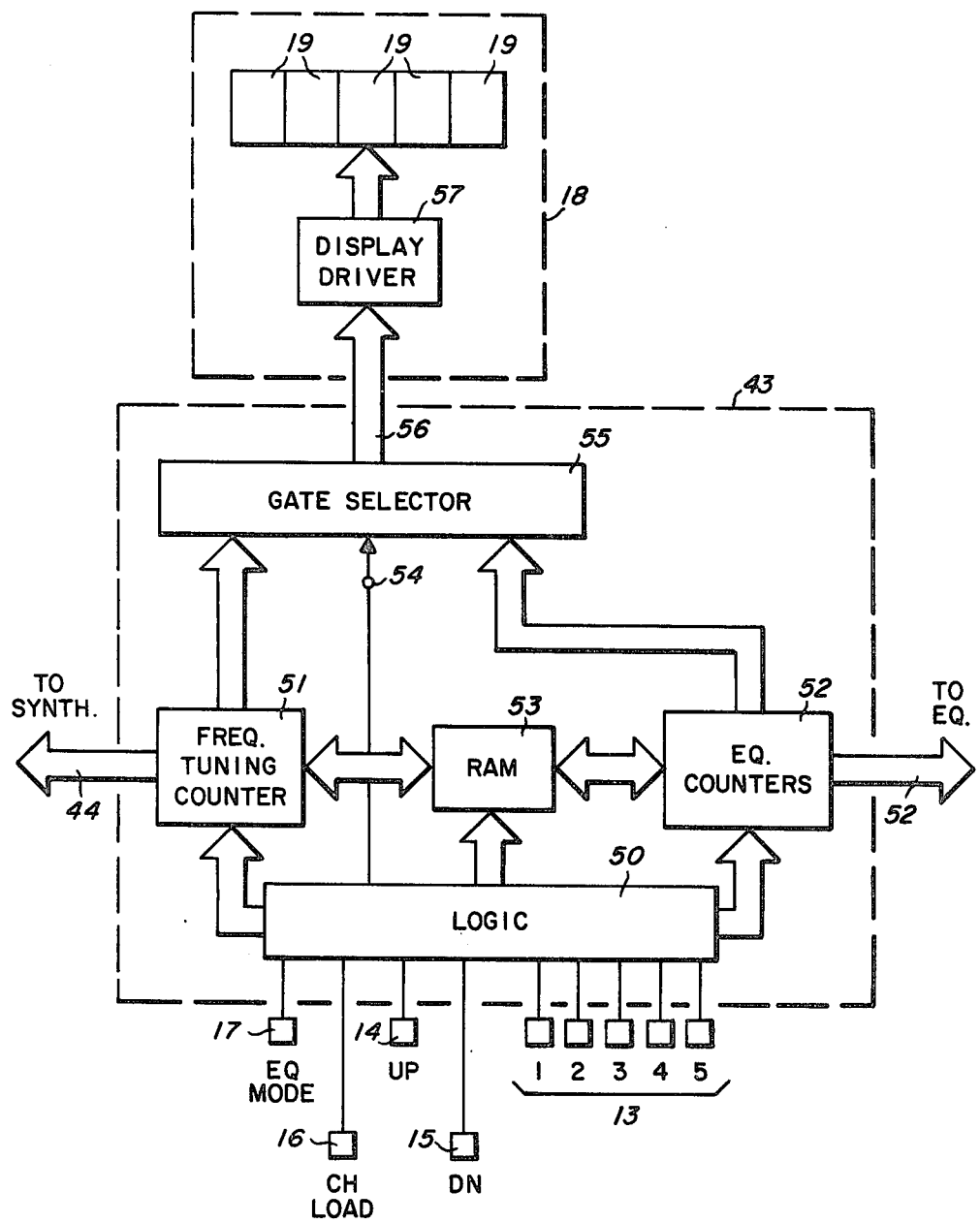
FIG. 3 is a simplified block schematic diagram of the control circuit and display shown in FIG. 2.

FIG. 3 essentially illustrates a simplified embodiment for the control circuit 43 and display 18 shown in FIG. 2. It should be remembered that preferably the control circuit 43 will be realized by a microprocessor and that the generalized flow chart in FIG. 4, besides applying to the embodiment shown in FIG. 3, would also generally apply to microprocessor implementations for the control circuit 43.

FIG. 3 illustrates that the manual pushbutton controls 13–17 are received by a logic circuit 50 contained in the control circuit 43. The logic circuit 50 is coupled to and provides control signals to both a frequency tuning counter 51 and a plurality of five equalizer counters 52. The circuit 50 is also coupled to and controls the operation of a RANDOM ACCESS MEMORY (RAM) 53, and is coupled to and provides a control signal to a terminal 54 of a gate selector circuit 55. The RAM 53 is coupled to and receives and supplies signals to and from the counters 51 and 52 in accordance with the control signals received from the logic circuit 50, and the gate selector 55 is coupled to and receives counter output signals from the counters 51 and 52 and supplies input signals to the display 18 along a connection 56 in accordance with the received counter signals and the control signal at the terminal 54. The counters 51 and 52 supply electronic control signals along lines 44 and 45 to the synthesizer 33 and equalizer circuit 40, respectively. A display driver 57 of the display 18 receives the selected counter signals provided on the line 56 and supplies the proper drive signals for each of the display units 19 which comprise the visible portion of the display 18. Essentially the count of the counter 51 controls the tuning of the radio receiver by controlling the operation of the synthesizer 33. The equalizer counters 52 essentially comprise five individual counters which independently control different audio subband emphasis networks in the equalizer circuit 40. The operation of the components shown in FIG. 3 will now be discussed with reference to the flow chart shown in FIG. 4 which illustrates the general operation of the components shown in FIG. 3.

Figure 4:
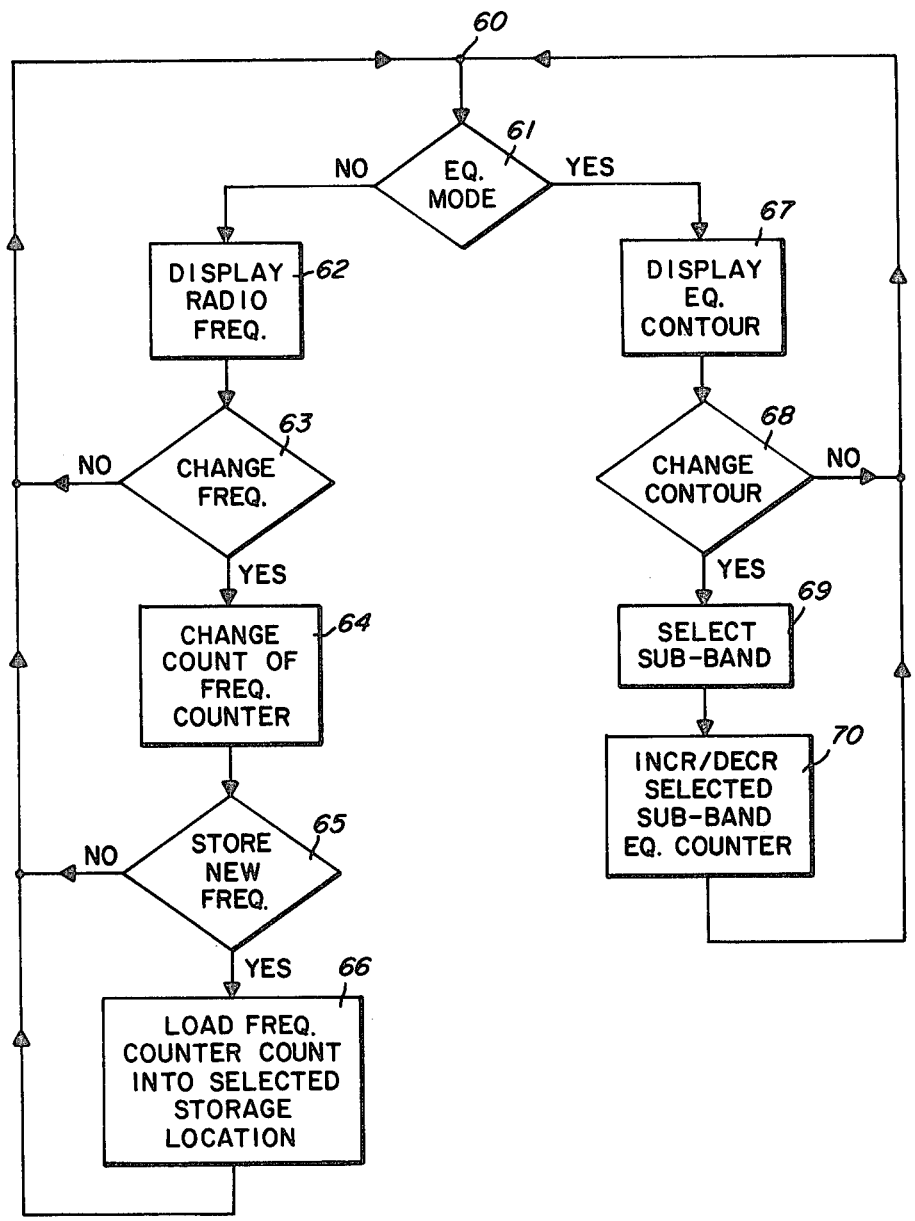
FIG. 4 is a flow chart for the operation of the components shown in FIG. 3.

The flow chart shown in FIG. 4 is entered at an initial terminal 60. An equalizer mode decision block 61 tests whether manual controls (pushbutton 17) of the receiver 10 have implemented an equalizer mode. If not, the receiver 10 is in a radio tuning mode and the command flow proceeds to a process block 62 which causes the display 18 to display, in Arabic numeral form, the frequency to which the radio receiver is tuned. This is implemented by having the logic circuit 50 control the gate selector 55 so as to pass the count of the counter 51 to the display driver rather than pass the count of the equalizer counters 52. The command flow then proceeds to a decision block 63 which determines whether a change in the frequency to which the receiver 10 is tuned is desired. If no frequency change is desired, then the command flow proceeds back to the initiating terminal 60 for reinitiation of the command flow sequence. In the flow charts discussed herein returning to the initial terminal reinitiates the entire command flow sequence. If a change in frequency is desired, and this is sensed by the logic circuit 50 monitoring the pushbutton controls 13–15, then the command flow proceeds to a process block 64 in which the logic circuit 50 implements a change in the count of the frequency counter 51. This results in changing the control signal supplied by the counter 51 along the line 44 to the synthesizer 33, and this thereby implements a change in the tuning of the radio receiver 10. At the same time, the gate selector 55 passes the changed count of the counter 51 to the display driver 57 such that the newly selected channel frequency is displayed. After implementing the change in the frequency count, the command flow then continues to a decision block 65 which determines whether or not the manual controls of the receiver 10 desire storing this new frequency for later recall. This essentially involves the logic circuit 50 monitoring the CHANNEL LOAD pushbutton 16. If storing the new frequency is not desired, as indicated by the nondepression of the CHANNEL LOAD button 16 within a predetermined time after changing the count of counter 51, then the command flow returns to the initial terminal 60. If storing the new frequency is desired, then the command flow continues to a process block 66 which results in loading the new frequency information, corresponding to the new count of the counter 51, into a selected storage location contained in the RAM 53. This is accomplished by the operator of the radio first depressing the CHANNEL LOAD button 16 to indicate that storing a frequency is desired, and then depressing one of the presettable pushbuttons 13 to indicate what storage location is to contain this new frequency. After storing the new frequency in a selected corresponding storage location, then the command flow returns to the initial terminal 60.

Essentially, the entire series of logic steps represented by the blocks 62–66 comprise the essential steps of an electronically tunable radio having presettable pushbuttons for directly recalling preselectable, predetermined channel frequencies, while also having some type of manual tuning, corresponding to the UP/DOWN scan buttons 14 and 15 for stepping the radio in discrete tuning implements over all channels in a predetermined band. This type of electronically tunable radio is known in the art, and U.S. Pat. No. 4,081,752 illustrates such an electronically tunable radio and the disclosure of this patent is hereby incorporated by reference. This referenced patent specifically illustrates the use of presettable pushbuttons to recall electronically stored different channel frequencies while also illustrating the use of an UP and DOWN step tuning switch to selectively step through the entire desired band in discrete tuning increments until a desired channel is arrived at. Since these features of the present invention are known in the art, they will not be further discussed herein.

If the decision block 61 determines that the radio receiver is to implement an equalizer mode of operation, then the command flow continues to a process block 67 which causes the display 18 to implement a visual display of the equalizer contour curve comprising the simultaneous display of the relative emphasis of all five audio subbands by the display units 19. This is accomplished by the logic circuit 50 controlling the gate selector 55 such that the display driver 57 now receives input signals related to the counts of the equalizer counters 52 rather than a count related to the count of the frequency counter 51. After the process block 67, the command flow continues to a decision block 68 which determines if a change in the equalizer contour is desired. If no change is desired then the command flow returns to the initial terminal 60. If a change is desired, and this is determined by now monitoring the actuation of the pushbutton controls 13 followed by the actuation of one of the pushbuttons 14 or 15, then the command flow continues to a process block 69 which selects one of the five audio subbands for emphasis adjustment in accordance with which one of the pushbuttons 13 was actuated. This is accomplished by selecting one of five equalizer counters in component 52 corresponding to the selected subband. The command flow then continues to a process block 70 which increments or decrements the selected subband equalizer counter in accordance with whether the UP or DOWN scan pushbutton 14 or 15 has been actuated. This incrementing or decrementing is contemplated as continuing until the release of manual pressure on the UP or DOWN pushbutton. This mode of operation generally corresponds to the incrementing and decrementing of the frequency counter 51 in response to the actuation of the pushbuttons 14 and 15 when the radio receiver is in the tuning mode. After suitably adjusting the emphasis of the selected subband, the command flow then returns to the initial terminal 60. Essentially, the logic circuit 50 implements changing the equalizer contour by responding to actuation of one of the pushbuttons 13 such that one of five counts held by the equalizer counters 52 which control the relative emphasis of the equalizer circuit 40, can now be adjusted by subsequent actuation of the UP/DOWN scan pushbuttons 14 and 15.

Thus the present invention, as illustrated by the circuitry and flow chart shown in FIGS. 3 and 4 provides a radio receiver having an integral equalizer circuit. The receiver has a tuning mode during which presettable pushbuttons and UP and DOWN step tuning controls tune the radio, and it has an equalizer mode wherein these same pushbuttons control the adjustment of counters that determine the relative emphasis of audio signals in audio subbands. At the same time, frequency indicating displays are provided during the tuning mode to indicate the channel that the receiver is tuned to, whereas equalizer emphasis displays are provided during the equalizer mode to provide a visual indication of the amount of relative emphasis which exists for subbands of the audio signals provided as the output of the radio receiver 10.

It should be noted that only the essential components for the present invention have been illustrated herein, and that many other variations, such as providing controls for an equalizer defeat mode during which all audio subbands are adjusted to have no relative emphasis, is also within the capability of the present invention. Having such an equalizer defeat mode is a standard feature of graphic equalizers.

The present invention will now be discussed with respect to FIGS. 5 and 6 which illustrate in substantially greater detail the general circuit shown in FIG. 3 and the general flow chart shown in FIG. 4. Again, identical reference numbers will be utilized to identify corresponding components.

Figure 5:
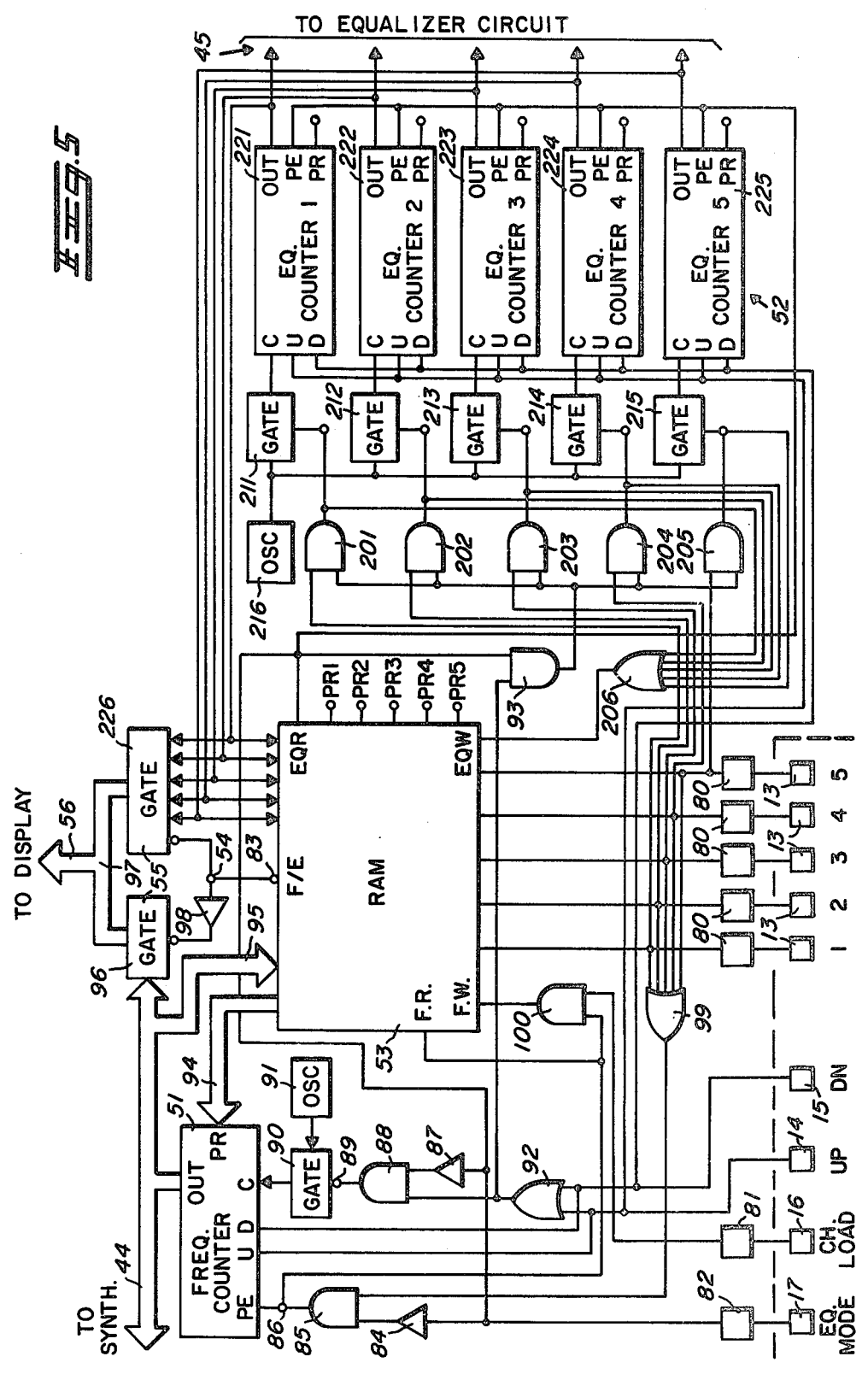

FIG. 5 essentially illustrates a typical embodiment of the control circuit 43 which preferably would be implemented by a programmed microprocessor which would respond to various sequential actuations of the manual controls 13–17 and provide the desired results previously stated. Essentially, each one of the manual pushbuttons 13 is initially connected to a latch (hold) circuit 80 which essentially comprises a resettable flip-flop that is toggled into an active state by manual actuation of any one of the pushbuttons 13 and is reset by actuation of any of the other pushbuttons 13 or the actuation of various other controls. The channel load pushbutton 16 is also initially connected to a similar latch 81, and the equalizer pushbutton 17 is connected to a similar latch 82. The purpose of the latches 80–82 is to provide a continuous logic signal in response to the momentary actuation of a pushbutton wherein this logic signal will continue until the resetting of the latch. The equalizer latch 82 is directly coupled as an input to the gate selector control terminal 54 and a FREQUENCY or EQUALIZER (F/E) mode selector terminal 83 of the RAM 53. The selector terminal 83 essentially causes the RAM to access either the frequency count storing portions of the RAM or the equalizer count storing portions of the RAM in accordance with whether or not a high or low logic signal is present at the terminal 83. It is contemplated that in a tuning mode of operation for the receiver 10, the latch 82 will provide a low logic signal output at the terminals 83 and 54.

The output of the latch 82 is also coupled through an inverter 84 as an input to an AND gate 85 having an output at a terminal 86 which is directly coupled to a PRESET ENABLE (PE) terminal of the frequency counter 51. In addition, the output of the latch 82 is coupled through an inverter 87 as an input to an AND gate 88 having its output provided at a terminal 89 that is a control terminal of a gate circuit 90 which selectively passes pulses from an oscillator circuit 91 through it to the count terminal C of the frequency counter 51 in accordance with the signals at the terminal 89. The UP and DOWN pushbuttons 14 and 15, which are intended to produce high logic signals only when actuating pressure is present on these pushbuttons, are directly connected to UP and DOWN control terminals (U and D) of the frequency counter 51, as well as serving as inputs to an OR gate 92 having its output coupled as an input to the AND gate 88 and coupled as an input to an AND gate 93.

The frequency counter 51 receives a PRESET COUNT (PR) input from selected storage locations in the RAM 53 along a connection line 94, and the output count of the frequency counter 51 is supplied to the RAM 53 along a connection line 95, to the synthesizer 33 along the connection 44, and, as as input, to a gate 96 which is part of the gate selector 55. The output of the gate 96 is coupled to a terminal 97 and the gate receives a control signal by virtue of being coupled to the terminal 54 through an inverter 98. A FREQUENCY READ (FR) terminal of the RAM 53 receives a control input by virtue of a direct connection to the terminal 86. Each of the five latches 80 supplies separate input signals to both the RAM 53 and an OR gate 99 which has its output coupled as an input to the AND gate 85. The output of the latch 81 is supplied as an input to an AND gate 100 which receives another input by virtue of direct connection to the terminal 86 and supplies an output to a FREQUENCY WRITE (FW) terminal of the RAM 53.

The above-recited structure of components in FIG. 5 implements the presetting of the electronic tuning pushbuttons 13 as well as implements having these pushbuttons recall preset tuned frequencies, and having the UP and DOWN pushbuttons step tune the radio receiver 10 across an entire selected band in discrete tuning increments. This can be illustrated by reference to the left hand side of the flow chart shown in FIG. 6 taken in conjunction with the following description. In analyzing the operation of the structure in FIG. 5, it should be noted that it is contemplated that actuation of any of the pushbuttons 13–16 results in the production of a high logic state signal by the pushbutton and its associated latch, while actuation of the pushbutton 17 alternately provides low (tuning) and high (equalizer) output states for the latch 82.

Figure 6:
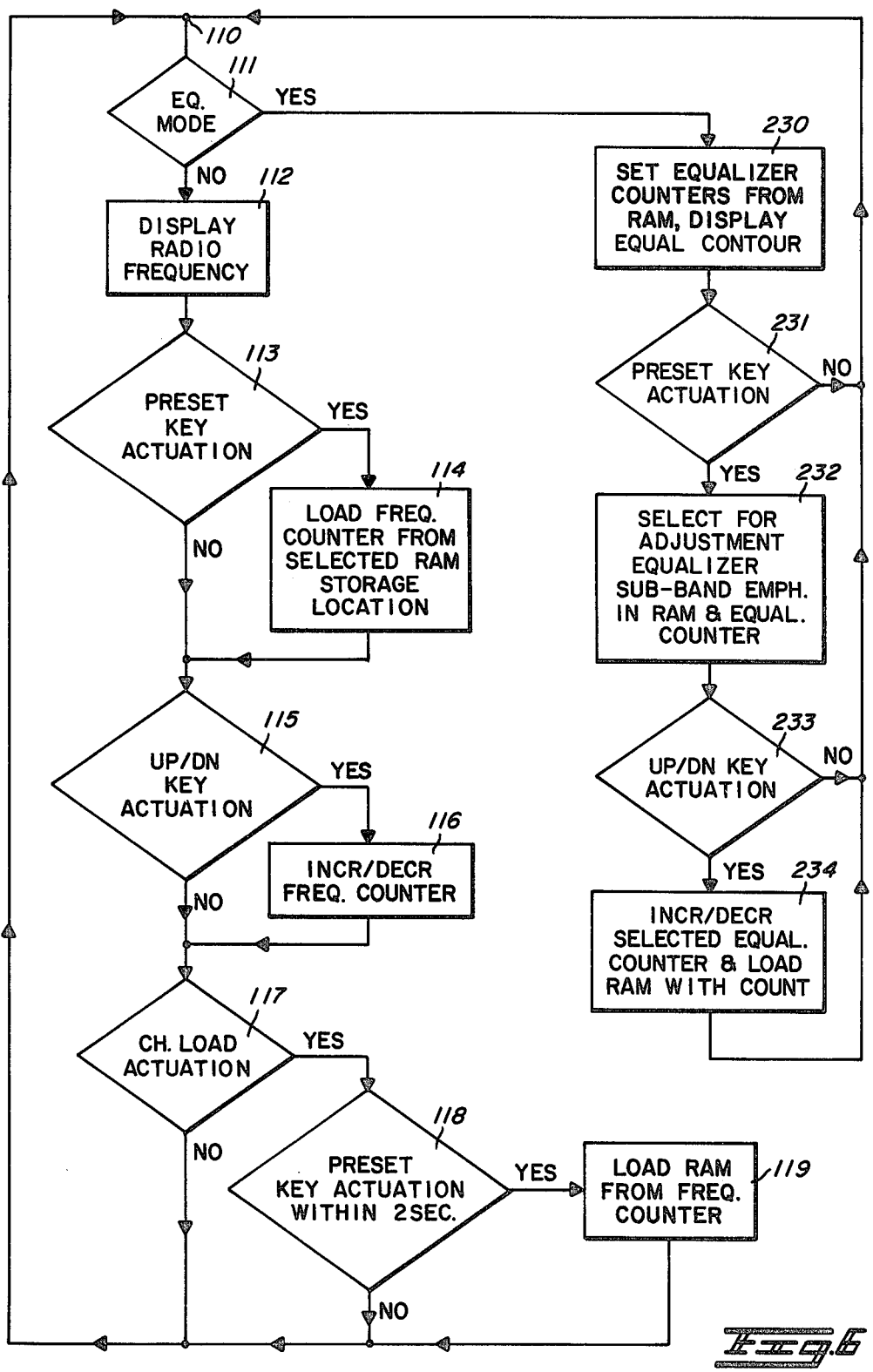
FIG. 6 is a flow chart for the operation of the circuitry shown in FIG. 5.

Referring now to FIGS. 6 and 5 simultaneously, the flow chart in FIG. 6 is entered at an initial terminal 110. The command flow then proceeds to an equalizer mode decision block 111 which determines whether the manual controls for the radio receiver have implemented an equalizer mode, in which case the right side of the flow chart will be followed, or whether they have implemented a tuning mode, in which case the left side of the flow chart will be followed. The equalizer mode determination provided by the decision block 111 is accomplished in response to the logic signal produced by the equalizer latch 82. In response to a low logic signal provided by the latch 82, the frequency tuning mode is selected and this results in (1) selecting the frequency storage locations of the RAM 53 by virtue of the signal at the terminal 83, (2) passing the count of the counter 51 through the gate 96 to the control terminal 97 that determines the control signal supplied on the line 56 to the display 18, and (3) allowing the production of high logic signals by the AND gates 85 and 88, in response to appropriate switch actuation, wherein these AND gates result in either presetting the count of the frequency counter 51 or step incrementing the count of the counter 51, respectively.

FIG. 6 illustrates that when the equalizer mode is not selected by the decision block 111, which therefore indicates the existence of the tuning mode, the command flow passes to a process block 112 which displays the radio frequency to which the receiver 10 is tuned. This essentially corresponds to a low logic signal from the latch 82 resulting in the gate 96 utilizing the count of the counter 51 to supply display control signals to the display 18 by virtue of the connection line 56.

After the process block 112, the command flow proceeds to a decision block 113 which analyzes if any of the preset keys 13 have been actuated. If this is the case, then the command flow proceeds to a process block 114, and a high logic signal will be produced by the OR gate 99 resulting in a high logic signal being produced by the AND gate 85 at the terminal 86. This is received at the PRESET ENABLE terminal of the counter 51 and results in loading this counter with a predetermined count stored in the RAM 53. The address of this predetermined count is determined by virtue of the RAM 53 receiving control signals from the latches 80 which indicate which key has been depressed. It should be noted that it is contemplated that a high logic signal at the terminal 86 will result in only a short duration PRESET ENABLE mode for loading the counter 51. This can be accomplished by either standard frequency counters or by utilizing a monostable circuit for coupling the terminal 86 to the PRESET ENABLE terminal of the counter 51. The above-described operations of the counter 51 are contemplated as being implemented by the process block 114 in FIG. 6 which presets the counter from selected RAM storage locations in response to preset key actuation.

In the event of nonactuation of a preset key 13, or after implementation of the process block 114, the command flow proceeds to an UP/DOWN key actuation decision block 115 which investigates if either of the UP/DOWN scan buttons 14 or 15 has been actuated. Essentially decision block 115 corresponds to OR gate 92 which produces an output logic state in response to actuation of either UP pushbutton 14 of DOWN pushbutton 15. If either of the UP or DOWN pushbuttons are depressed, decision block 115 channels the command flow to a process block 116 that results in incrementing or decrementing the frequency counter 51. This is caused by the OR gate 92 causing the AND gate 88, in the tuning mode, to provide a high logic output which allows the gate 90 to pass oscillator pulses into the frequency counter 51 that result in incrementing or decrementing the count of the counter in accordance with the UP or DOWN control signals received at the U or D terminals of the counter 51. As was previously mentioned, the count of the counter 51 determines the tuning of the radio receiver via the connection of this count to the synthesizer 33 along the line 44.

If the UP or DOWN keys have not been actuated, or after the implementation of the process block 116, the command flow then continues to a channel load actuation decision block 117 which determines if the channel load pushbutton 16 has been actuated. If actuation has not occurred, then the command flow returns to the initial terminal 110. If the channel load pushbutton 16 has been actuated, then the command flow continues to a decision block 118 which decides if actuation of one of the preset keys 13 has occurred within two seconds after the actuation of the channel load pushbutton 16. The two second delay can readily be accomplished by following the latch circuit 81 with a monostable circuit having a two second duration. Other techniques of two second delay are also possible and could be implemented in a microprocessor implementation for the present invention. The determination of whether one of the preset keys 13 was actuated after the channel load pushbutton 16 can be accomplished by utilizing the channel load actuation to reset all of the latches 80 and then looking for the creation of a high logic signal at terminal 86 within the next two seconds.

If actuation of a preset key does not occur within the two second period, then the command flow also returns to the initial terminal 110. If one of the preset pushbuttons 13 is depressed within two seconds after the actuation of the channel load pushbutton 16, then the decision block 118 channels the command flow to a process block 119 which loads a preselected storage location in the RAM 53 with the count now being held in the counter 51. The address of this preselected storage location in the RAM 53 is determined by virtue of the connections of the latch circuits 80 to the RAM 53 which define an address corresponding to the actuated pushbutton 13. This results in erasing the count which was previously held in this storage location by the RAM 53. This is all accomplished by virtue of the AND gate 100 responding to the two second latched output from the latch 81 and from the output of the AND gate 85 indicating the actuation of one of the pushbuttons 13. In response to the coincidence of these two conditions, the AND gate 100 produces a high logic output which is received at the FREQUENCY WRITE terminal of the RAM 53 resulting in transferring, along connection line 95, the output count of the counter 51 into a preselected storage location in the RAM 53.

It should be noted that it is contemplated that a delay exists between creating a high logic signal at terminal 86 and the presetting of the counter 51, while the RAM 53 will write frequencies into storage locations in response to the signal at terminal 86 without a delay. This insures that the RAM 53 writes the new count before the counter 51 is preset. This is readily accomplished through the use of standard delay circuits.

As noted before, the left hand side of the flow chart in FIG. 6 along with the above-described operation of the radio receiver 10 in the tuning mode, merely corresponds to a pushbutton electronically tunable radio having presettable electronic tuning pushbuttons for direct channel recall and a step tuning mechanism for scanning all channels in a preselected band. Thus the above-described structure generally corresponds to similar structure described in U.S. Pat. No. 4,081,752 which also implements this type of operation.

Besides implementing the electronic tuning mode as described above, the present invention also implements an equalizer mode of operation for the radio receiver 10, and this will now be discussed in detail with respect to the right hand side of the flow chart in FIG. 6 and the remaining components illustrated in FIG. 5.

The output of each of the latches 80 for the presettable pushbuttons 13 is connected as one input to five corresponding AND gates 201-205, respectively. Another input to each of the AND gates 201-205 is received by virtue of a common connection to the output of the AND gate 93. The output of each of the AND gates 201-205 is coupled as an input to an OR gate 206 which has its output connected to an EQAULIZER WRITE (EQW) terminal of the RAM 53. The output of each of the AND gates 201-205 is also coupled to a corresponding control terminal of a plurality of five gates 211-215, respectively.

Each of the gates 211-215 receives an input from a single oscillator 216, and the output from each of the gates 211-215 is coupled to a count terminal C of a plurality of five independent equalizer counters 221-225, respectively. Each of the counters 221-225 receives UP/DOWN control signals by virtue of direct connections to the UP/DOWN pushbuttons 14 and 15. In addition, each of the equalizer counters 221-225 has a PRESET ENABLE (PE) terminal which is directly coupled to the output of the equalizer latch 82. This results in initially presetting each of these counters in response to the initial selection of an equalizer mode of operation by the equalizer pushbutton 17 causing the latch 82 to provide a high logic signal as its output. The output of the latch 82 is also received by an EQUALIZER READ (EQR) terminal of the RAM 53. Each of the equalizer counters 221-225 also receives preset equalizer counts at terminals PR along connection lines PR1-PR5 from the RAM 53 (These connections are not fully shown in FIG. 5 to maintain the clarity of the drawing). This results in having the counters 221-225 preset in response to the initial selection of the equalizer mode by the pushbutton 17 wherein this presetting results in the RAM 53 supplying preset stored counts to each of the counters 221-225 from predetermined equalizer storage locations within the RAM.

The output count of each of the equalizer counters 221-225 is coupled to the equalizer circuit 40 along the connection line 45. In addition, the output counts from the equalizer counters are also coupled to both the RAM 53 and a gate 226 which is part of the gate selector 55. The gate 226 receives a control signal by virtue of a direct connection to the terminal 54 and selectively provides for passing the count of the equalizer counters 221-225 through the gate 226 to the terminal 97 in accordance with the control signals at the terminal 54. The operation of the equalizer mode implementing circuitry in FIG. 5 will now be described with reference to the flow chart in FIG. 6.

If the equalizer mode decision block 111 determines that an equalizer mode has been selected, the command flow passes to a process block 230 which results in setting the equalizer counters 221-225 at predetermined counts stored in the RAM 53, and then displaying the equalizer contour. The term "equalizer contour" refers to the aggregate relative emphasis provided by the equalizer circuit 40 to all five audio subbands. This is accomplished by producing a logic signal at the PRESET ENABLE terminals of the counters 221-225 which loads these counters with counts stored in the RAM 53, and then opening the gate 226 while closing the gate 96 such that now the count signals from the counters 221-225 are received at the terminal 97 instead of the count from the frequency counter 51. In this manner the display connection line 56 now causes the display 18 to provide a display related to the stored equalizer counts which are related to the amount of relative emphasis of the audio subbands since these counts also determine the electronic control signals supplied along the line 45 that control the operation of the equalizer circuit 40. It should be noted that during the equalizer mode, the count of the frequency counter 51 is maintained such that the control signals on the line 44, which tune the radio receiver 10, are held constant. Similarly, during the tuning mode operation of the receiver 10 the equalizer control signals supplied along the line 45 are also maintained constant at their previous levels.

After implementing the process in the block 230, the command flow proceeds to a decision block 231 which determines if any of the preset keys 13 have been actuated. If no keys have been actuated the command flow returns to the initial terminal 110. If any of the keys 13 have been actuated, the decision block 231 channels the command flow to a process block 232 which results in selecting an equalizer subband relative emphasis, stored in the RAM and now also being held in one of the equalizer counters, for adjustment. Acutally one of the equalizer counters 221-225 is selected for adjustment.

This is accomplished by the RAM 53 receiving input signals from the latches 80 which determine a selected storage location in the RAM which corresponds to the location where the relative emphasis for one of the audio subbands whose count is controlled by one of the counters 221–225 has been stored. This is also accomplished by providing one high logic input to one of the AND gates 201–205 which is associated with the actuated preset key 13 corresponding to the audio subband selected for emphasis adjustment. After the process block 232, the command flow continues to a decision block 233 which determines whether either of the UP or DOWN pushbuttons 14 or 15 has been actuated. If neither of these pushbuttons has been actuated within a predetermined time after actuation of a preset key 13, then the command flow returns to the initial terminal 110. If either of the pushbuttons 14 or 15 has been actuated within a predetermined time after one of the preset keys 13, then the decision block 233 channels the command flow to a process block 234 which results in incrementing or decrementing the selected equalizer counter (which was selected by the prior actuation of one of the presettable pushbuttons 13) and loads the incremented or decremented count of that counter into the RAM 53 with the newly arrived at count. This essentially accomplished by having the output of the OR gate 92 coupled as an input to the AND gate 93 which results in having a selected one of the gates 211–215 pass oscillator 216 clock pulses to a corresponding one of the counters 221–215 such that a selected one of these counters will be incremented or decremented. This provides a new count in the selected counter that will serve as a control signal for the equalizer circuit 40, as well as a new control signal for one of the equalizer band displays produced by the display 18. The new count also serves as a new input signal to the RAM 53 wherein this new input signal will be written into the RAM memory, by virtue of the OR gate 206, at a storage location selected by the prior actuation of one of the preset keys 13. It should be remembered that during the equalizer mode, the signal at the terminal 83 has caused the RAM 53 to now utilize only the equalizer storage locations it contains, rather than the frequency storage locations which it contains. After the implementation of the process block 234, the command flow is then returned to the terminal 110.

Thus, the present invention has provided for utilizing the same presettable pushbuttons which directly recall predetermined channel frequencies to provide the additional function of selecting corresponding subbands of the audio response for relative emphasis adjustment, while also using UP/DOWN buttons which are operative in the tuning mode for tuning the receiver over a frequency band to alter the selective emphasis provided for the audio subband selected by actuation of one of the presettable pushbuttons 13. All of this has been accomplished while also utilizing a common display comprising five digital display units 19 to selectively provide a display indicating either the channel frequency to which the receiver is tuned or to display, simultaneously, the relative emphasis of all five audio subbands which can be adjusted by the graphic equalizer of the present invention. Thus the number of controls required for the present entertainment device having an integral graphic equalizer has been minimized while also minimizing the space required for displaying the frequency indicating information and graphic equalizer indicating information. This savings has now made it possible to provide a compact unit for mounting in the dashboard of an automobile wherein individual adjustment of the relative emphasis of audio subbands is possible.

It should be noted that while the present invention illustrates the use of the UP/DOWN buttons which, in the tuning mode, cause the UP/DOWN scanning of the radio receiver in discrete tuning increments throughout a selected band, the present invention also contemplates the use of any UP/DOWN switch which in the tuning mode provides one function, such as adjusting the volume of the radio in discrete increments, but in the equalizer mode is utilized for adjusting the relative emphasis of an audio subband selected by the actuation of a presettable tuning channel direct recall pushbutton such as the pushbuttons 13.

With respect to the different displays provided by the present invention for displaying the channel frequency or the equalizer contour, the following should be noted. It is contemplated that in the tuning mode the display driver 57 functions in response to the count at terminal 97 to provide standard seven-segment direct drive excitation signals for the four vertical bars 21 and the top, bottom and middle horizontal bars 20 of each display unit 19 so as to provide an Arabic numeral indication of channel frequency. This type of operation is standard. In the equalizer mode it is contemplated that the display driver 57 will receive five individual counts from the counters 221–225 at the terminal (wherein each of the counters 221–225 can register any of five possible counts). In response to each count from the five equalizer counters, the driver 57 will select one of the five horizontal bars 20 of a display unit 19 associated with one of the counters 221–225 for excitation. This can be accomplished by elementary logic processing components as is well understood by persons of average skill in the art. Thus, it is understood that effectively the display driver 57 comprises two types of display drivers which are alternately utilized for exciting the display units 19 depending on whether the receiver 10 is in either a tuning or equalizer mode of operation.

FIG. 7 illustrates a typical embodiment for the electronically controllable equalizer circuit 40. Essentially the electronically controllable equalizer circuit is illustrated as comprising five substantially identical audio subband emphasis networks 301–305, each associated with a different one of the audio subbands and each responsive to a different one of the counters 221–225, wherein only the details of emphasis network 301 (shown dashed) are illustrated. Essentially, the network 301 receives an input by virtue of a direct connection to the input terminal 39. This terminal is connected through a resistor 306 to a positive input terminal 307 of an operational amplifier 308. The output of the operational amplifier 308 is directly connected to the terminal 41, and the output is also connected to a negative input terminal 309 of the operational amplifier 308 through a resistor 310. The terminals 307 and 309 are coupled together through the resistive element of an electronically controllable potentiometer 311 controlled by virtue of a control circuit 312. A wiper arm of the potentiometer 311 is coupled through a capacitor 313 to an interim terminal 314 that is coupled through a resistor 315 to the output of an operational amplifier 316 which has its output directly coupled to its negative input terminal. The intermediate terminal 314 is coupled through a capacitor 317 to the positive input terminal of the operational amplifier 316, and this positive input terminal is coupled to ground through a resistor 318.

Essentially, the components 313–318 form a frequency determining portion of the network 301 thus limiting the emphasis effect of this circuit to predominately an associated one of five audio subbands of the audio band. The amount of relative emphasis for the corresponding audio subband is determined by the wiper arm setting of the potentiometer 311 which is in turn controlled by the circuit 312. The circuit 312 receive a count input control signal from the equalizer counter 221 and controls the setting of the potentiometer 311 in accordance therewith. The control 312 can comprise either a digital-to-analog converter which thereby provides an analog control signal to control a servomechanism motor for moving the wiper arm, or the control 312 could be a digital processing circuit which alters the setting of the potentiometer 311 directly in discrete digital increments without first converting the digital control signal to an analog control signal. Also direct analog or digital electronic implementation of a potentiometer is contemplated and would in general be preferred. Also other electronically controllable emphasis networks are possible which use passive filters for separating the audio band into subbands and use gain controlled amplifiers for emphasis adjustment. In all of these embodiments, the essence of the equalizer circuit 40 is that five independently controllable emphasis networks for five corresponding audio subbands are electronically controlled by five independent control signals. It is contemplated that each of these control signals will correspond to the output count of one of the equalizer counters 221–225 to thereby realize the equalizer circuit 40 as an electronically controllable equalizer circuit providing selective emphasis to audio subbands in accordance with digital electronic control signals.

While I have shown and described specific embodiments of this invention, further modifications and improvements will occur to those skilled in the art. All such modifications which retain the basic underlying principles disclosed and claimed herein are within the scope of this invention.

I claim:

1. A multichannel entertainment device with an audio graphic equalizer, comprising:
   multichannel entertainment means tunable to select any of a plurality of entertainment channels for providing corresponding audio signals in an audio band related to the selected entertainment channel;
   equalizer means coupled to said entertainment means for independently adjusting the relative emphasis of said audio signals in each of a plurality of audio subbands within said audio band;
   common visual display means for selectively providing either of two displays, in a tuning mode of said entertainment device said display means displaying an indication of the entertainment channel to which the entertainment means is tuned, and in an equalizer mode of said entertainment device said display means displaying an electronic display indication of the relative emphasis provided by said equalizer means to the audio signals in said plurality of subbands; and
   control means coupled to said entertainment means, said equalizer means and said display means for selectively implementing said equalizer mode wherein said display means displays the relative emphasis of said audio subbands rather than said indication of the tuned entertainment channel, and for selectively implementing said tuning mode wherein said display means displays the indication of the entertainment channel rather than the relative emphasis of said audio subbands.

2. A multichannel entertainment device with an audio graphic equalizer, comprising:
   multichannel entertainment means tunable to select any of a plurality of entertainment channels for providing corresponding audio signals in an audio band related to the selected entertainment channel;
   equalizer means coupled to the entertainment means for independently adjusting the relative emphasis of said audio signals in each of a plurality of audio subbands within said audio band;
   visual display means coupled to said entertainment means and said equalizer means for providing indications of the entertainment channel to which the entertainment means is tuned and the relative emphasis of the audio signals in said plurality of subbands; and
   control means coupled to said entertainment means and said equalizer means and including manual controls for selectively implementing a tuning mode or an equalizer mode, for said entertainment device, wherein in said tuning mode actuation of some of said manual controls selects entertainment channels for said entertainment means, and wherein in said equalizer mode actuation of said some of said manual channel select controls selects subbands of said plurality of subbands for relative emphasis adjustment rather than selecting entertainment channels for tuning said entertainment means.

3. A multichannel entertainment device as claimed in claim 2 wherein said control means is coupled to said display means, said control means in said tuning mode causing said display means to provide a display indicating the entertainment channel to which the entertainment means is tuned rather than the relative emphasis provided by said equalizer means to audio signals in said plurality of subbands, and said control means in said equalizer mode causing said display means to indicate the relative emphasis provided by said equalizer means to audio signals in said plurality of subbands rather than the channel to which the entertainment means is tuned.

4. A multichannel entertainment device as claimed in claim 2 or 3,
   wherein said entertainment means comprises tuning means comprising a plurality of pushbuttons each of which are presettable to directly recall, upon actuation during said tuning mode, any one of said entertainment channels and tune said entertainment means to the recalled channel, and
   wherein said control means, when said entertainment means is in said equalizer mode, has structure for causing each of said pushbuttons, upon actuation, to select a predetermined one of said audio subbands for emphasis adjustment rather than to directly recall a channel and tune said entertainment means thereto.

5. A radio device with an audio graphic equalizer, comprising:
   radio means tunable to select any of a plurality of radio channels in a band for providing corresponding audio signals in an audio band related to the selected radio channel;
   equalizer means coupled to said radio means for independently adjusting the relative emphasis of said audio signals in each of a plurality of audio subbands within said audio band;

visual display means for selectively providing either of two displays, in a tuning mode of said radio device said display means displaying the radio channel to which the radio means is tuned, and in an equalizer mode of said radio device said display means displaying an electronic display indication of the relative emphasis provided by said equalizer means to the audio signals in said plurality of subbands; and radio control means coupled to said radio means, said equalizer means and said display means for selectively implementing said equalizer mode wherein said display means displays the relative audio emphasis of said audio subbands rather than said indication of the tuned radio channel, and for selectively implementing said tuning mode wherein said display means displays the tuned radio channel rather than the relative emphasis of said audio subbands.

6. A radio device with an audio graphic equalizer as claimed in claim 5, wherein said radio means comprises tuning means comprising a plurality of pushbuttons each of which are presettable to directly recall, upon actuation during said tuning mode, any one radio channel in said band and tune said radio means to said recalled channel, and a manual tuning means for adjustably tuning said radio means in said tuning mode, upon actuation, to any radio channels in said band.

7. A radio device with an audio graphic equalizer as claimed in claim 6, wherein said control means, when said radio means is in said equalizer mode, has structure for causing each of said pushbuttons, upon actuation, to select a predetermined one of said audio subbands for emphasis adjustment rather than to directly recall a radio channel and tune said radio means thereto.

8. A radio device with an audio graphic equalizer as claimed in claim 7, wherein said control means, in said equalizer mode, has structure for causing actuation of said manual tuning means to adjust the relative emphasis of any audio subband selected for emphasis adjustment by actuation of one of said pushbuttons rather than adjust the tuning of said radio means.

9. A radio device with an audio graphic equalizer as claimed in claim 8, wherein said manual tuning means comprises switch means which provide, upon actuation in said tuning mode, for stepping the radio channel tuning in upward or downward discrete tuning increments.

10. A radio device with an audio graphic equalizer as claimed in any of claims 5, 7 or 9, wherein said display means displays a numeric indication of said selected radio channel.

11. A radio device with an audio graphic equalizer according to claim 10, wherein said display means provides a bar graph displays representative of the relative emphasis plurality of electronic of said audio subbands.

12. A radio device with an audio graphic equalizer as claimed in claim 11, wherein each of said bar graph displays is provided for each audio subband and comprises a series of horizontal bars which are vertically stacked and wherein one of these horizontal bars is selectively illuminated, and wherein said display means simultaneously displays the relative emphasis in all of said audio subbands with each vertical stack of horizontal bars for each subband being disposed in a linear horizontal array.

13. A radio device with an audio graphic equalizer as claimed in claim 12, wherein some horizontal bars in each vertical stack of horizontal bars are utilized by said display means for indicating, in said tuning mode, the tuned radio channel in Arabic numeral form.

14. A radio device with an audio graphic equalizer as claimed in claim 5, wherein said radio means comprises tuning means comprising a plurality of pushbuttons each of which are presettable to directly recall, upon actuation during said tuning mode, any one radio channel in said band and tune said radio means to said recalled channel, and a manual tuning means for adjustably tuning said radio means in said tuning mode, upon actuation, to any radio channels in said band, wherein said control means, when said radio means is in said equalizer mode, has structure for causing each of said pushbuttons, upon actuation, to select a predetermined one of said audio subbands for emphasis adjustment rather than to directly recall a radio channel and tune said radio means thereto, and wherein said display means electronically displays a bar graph display representative of the relative emphasis of any of said audio subbands, and wherein each bar graph display provided for each displayed audio subband comprises a series of horizontal bars which are vertically stacked and wherein one of these horizontal bars is selectively illuminated, and wherein said display means simultaneously displays the relative emphasis in all of said audio subbands with each vertical stack of horizontal bars for each subband being disposed in a linear horizontal array, and wherein said pushbuttons are also disposed in a linear horizontal array with each pushbutton located in a vertical relationship with respect to an associated one of the vertical stacks of horizontal bars.

15. A radio device with an audio graphic equalizer, comprising:

radio means tunable to select any of a plurality of radio channels in a band for providing corresponding audio signals in an audio band related to the selected radio channel;

equalizer means coupled to said radio means for independently adjusting the relative emphasis of said audio signals in each of a plurality of audio subbands within said audio band;

display means for providing displays indicating the radio channel to which the radio means is tuned and the relative emphasis provided by said equalizer means to the audio signals in said plurality of audio subbands; and control means coupled to said radio means and said equalizer means and including manual controls for selectively implementing a tuning mode for said radio device wherein actuation of some of said manual controls results in selecting and tuning said radio means to said radio channels, and for selectively implementing an equalizer mode for said radio device wherein actuation of said some of said manual channel select controls provides for selecting subbands of said plurality of subbands for relative emphasis adjustment rather than selecting radio channels for tuning said radio means.

16. A radio device with an audio graphic equalizer according to claim 15, wherein said some of said manual controls comprise a plurality of pushbuttons each of which is presettable to directly recall, upon actuation, any one radio channel in said band during the tuning mode of said radio means, and wherein during said equalizer mode actuation of one of said plurality of said pushbuttons selects a predetermined one of said audio subbands for adjustment of the relative audio emphasis, rather than recall and tunably select a predetermined radio channel for said radio means.

17. A radio device with an audio graphic equalizer according to claim 16, wherein said control means implements said equalizer mode by switching from said radio channel tuning mode to said equalizer mode while maintaining said radio means tuned to the radio channel that the radio means was tuned to during said tuning mode.

* * * * *

UNITED STATES PATENT AND TRADEMARK OFFICE
CERTIFICATE OF CORRECTION

PATENT NO. : 4,285,065
DATED : August 18, 1981
INVENTOR(S) : DAVID J. PRINISKI

It is certified that error appears in the above—identified patent and that said Letters Patent is hereby corrected as shown below:

Col. 17, Line 58, delete "plurality of electronic".

Col. 17, Line 57, prior to "bar" insert --plurality of electronic--.

Signed and Sealed this

Fourteenth Day of September 1982

[SEAL]

Attest:

GERALD J. MOSSINGHOFF

Attesting Officer       Commissioner of Patents and Trademarks